United States Patent
Cheng

(10) Patent No.: US 10,475,371 B2
(45) Date of Patent: Nov. 12, 2019

(54) PIXEL CIRCUIT IN AN ELECTROLUMINESCENT DISPLAY

(71) Applicant: INT TECH CO., LTD., Taipei (TW)

(72) Inventor: Shih-Song Cheng, Kaohsiung (TW)

(73) Assignee: INT TECH CO., LTD., Taipei (TW)

(*) Notice: Subject to any disclaimer, the term of this patent is extended or adjusted under 35 U.S.C. 154(b) by 174 days.

(21) Appl. No.: 15/439,500

(22) Filed: Feb. 22, 2017

(65) Prior Publication Data

US 2018/0137816 A1    May 17, 2018

Related U.S. Application Data

(60) Provisional application No. 62/421,435, filed on Nov. 14, 2016.

(51) Int. Cl.
*G09G 3/20* (2006.01)
*G09G 3/30* (2006.01)
(Continued)

(52) U.S. Cl.
CPC ......... *G09G 3/2092* (2013.01); *G06F 3/1446* (2013.01); *G09G 3/30* (2013.01);
(Continued)

(58) Field of Classification Search
CPC ...... G06F 3/1446; G09G 3/2092; G09G 3/30; G09G 3/3208; G09G 3/3233;
(Continued)

(56) References Cited

U.S. PATENT DOCUMENTS 6,971,470 B2    12/2005   Tseng
7,271,785 B2    9/2007    Jang
(Continued)

FOREIGN PATENT DOCUMENTS

CN    1571005 A    1/2005
CN    1586094 A    2/2005
(Continued)

OTHER PUBLICATIONS

Office Action and search report dated Jun. 22, 2018, issued in counterpart Taiwanese Patent Application No. 106129039, (9 pages) with English translation (2 pages).
(Continued)

*Primary Examiner* — Tom V Sheng
(74) *Attorney, Agent, or Firm* — Juan Carlos A. Marquez; Marquez IP Law Office, PLLC

(57) ABSTRACT

A circuit includes an electroluminescent (EL) device, a transistor, a first capacitor and a second capacitor. The transistor includes a gate coupled to a first node and a first terminal coupled to a second node. The first capacitor is coupled between a supply voltage and the first node. The second capacitor is coupled between the first node and the second node. The first capacitor and the second capacitor are configured to establish a compensation voltage associated with a threshold voltage of the transistor at the gate of the transistor in response to a first control signal, and establish the compensation voltage at the first terminal of the transistor in response to a second control signal. The transistor is configured to pass a current through the EL device. Moreover, the current has a magnitude independent of the threshold voltage of the transistor.

19 Claims, 10 Drawing Sheets

(51) Int. Cl.
| | |
|---|---|
| *H01L 29/417* | (2006.01) |
| *G06F 3/14* | (2006.01) |
| H01L 27/32 | (2006.01) |
| G09G 3/3208 | (2016.01) |
| G09G 3/36 | (2006.01) |

(52) U.S. Cl.
CPC ..... *H01L 29/41733* (2013.01); *G09G 3/3208* (2013.01); *G09G 3/3611* (2013.01); *G09G 2300/026* (2013.01); *G09G 2300/0439* (2013.01); *G09G 2300/0819* (2013.01); *G09G 2310/0278* (2013.01); *G09G 2320/0204* (2013.01); *G09G 2320/029* (2013.01); *G09G 2320/0233* (2013.01); *G09G 2320/045* (2013.01); *G09G 2330/02* (2013.01); *H01L 27/3244* (2013.01)

(58) Field of Classification Search
CPC .... G09G 3/3241; G09G 3/325; G09G 3/3258; G09G 3/3611; G09G 2300/026; G09G 2300/0439; G09G 2300/0819; G09G 2310/0251; G09G 2310/0278; G09G 2320/0204; G09G 2320/0233; G09G 2320/029; G09G 2320/043; G09G 2320/045; G09G 2330/02; H01L 23/528; H01L 27/3211; H01L 27/3248; H01L 27/3244; H01L 29/41733; H01L 29/78; H01L 51/5036
See application file for complete search history.

(56) References Cited

U.S. PATENT DOCUMENTS

| | | | |
|---|---|---|---|
| 7,463,222 B2 | 12/2008 | Fish et al. | |
| 7,675,494 B2 | 3/2010 | Hong et al. | |
| 9,330,603 B2 | 5/2016 | Kwak | |
| 10,229,639 B2 | 3/2019 | Ma | |
| 10,269,294 B2 | 4/2019 | Kwak | |
| 2005/0052365 A1 | 3/2005 | Jang | |
| 2006/0028408 A1* | 2/2006 | Kim | G09G 3/3233 345/76 |
| 2006/0290613 A1 | 12/2006 | Hong et al. | |
| 2007/0045620 A1* | 3/2007 | Park | G09G 3/3233 257/40 |
| 2010/0141645 A1* | 6/2010 | Choi | G09G 3/3233 345/214 |
| 2011/0181192 A1* | 7/2011 | Ono | G09G 3/3233 315/169.3 |
| 2011/0273428 A1* | 11/2011 | Han | G09G 3/3233 345/212 |
| 2012/0038617 A1* | 2/2012 | Chung | G09G 3/3233 345/212 |
| 2012/0146979 A1* | 6/2012 | Kim | G09G 3/3233 345/211 |
| 2013/0088474 A1 | 4/2013 | Wang et al. | |
| 2013/0106828 A1* | 5/2013 | Kim | G09G 3/3233 345/212 |
| 2013/0335307 A1 | 12/2013 | Guo et al. | |
| 2014/0145918 A1 | 5/2014 | Kwak | |
| 2014/0192037 A1* | 7/2014 | Chung | G09G 3/2022 345/212 |
| 2014/0232762 A1* | 8/2014 | Park | H01L 27/3265 345/690 |
| 2014/0313106 A1 | 10/2014 | In et al. | |
| 2014/0313241 A1 | 10/2014 | Ono et al. | |
| 2015/0154906 A1 | 6/2015 | Chung | |
| 2015/0170572 A1* | 6/2015 | Qing | G09G 3/3225 315/172 |
| 2015/0356916 A1* | 12/2015 | Qian | G09G 3/3233 345/78 |
| 2015/0379929 A1* | 12/2015 | Zhai | G09G 3/3233 345/78 |
| 2016/0125808 A1 | 5/2016 | Hsu et al. | |
| 2016/0140904 A1* | 5/2016 | Wu | G09G 3/3233 345/78 |
| 2016/0240138 A1* | 8/2016 | Xu | G09G 3/32 |
| 2016/0246409 A1* | 8/2016 | Yang | G06F 3/0412 |
| 2016/0253953 A1* | 9/2016 | Yang | G09G 3/3233 345/214 |
| 2016/0284270 A1* | 9/2016 | Sun | G09G 3/3233 |
| 2016/0307497 A1* | 10/2016 | Nie | G09G 3/3233 |
| 2016/0372030 A1* | 12/2016 | Nagayama | G09G 3/32 |
| 2016/0379553 A1* | 12/2016 | Cho | G09G 3/3233 345/76 |
| 2017/0018224 A1* | 1/2017 | Lee | G09G 3/3233 |
| 2017/0039942 A1* | 2/2017 | Han | G09G 3/32 |
| 2017/0178567 A1* | 6/2017 | Kang | G09G 3/3233 |
| 2017/0301289 A1* | 10/2017 | Jeong | G09G 3/3233 |
| 2018/0108295 A1* | 4/2018 | Ebisuno | G09G 3/3233 |
| 2018/0137807 A1* | 5/2018 | Cheng | G09G 3/2092 |
| 2018/0218680 A1* | 8/2018 | Cai | G09G 3/3233 |
| 2018/0301092 A1 | 10/2018 | Ma | |

FOREIGN PATENT DOCUMENTS

| | | |
|---|---|---|
| CN | 1679073 A | 10/2005 |
| CN | 1889159 A | 1/2007 |
| CN | 103035198 A | 4/2013 |
| CN | 103137069 A | 6/2013 |
| CN | 103150991 A | 6/2013 |
| CN | 103295519 A | 9/2013 |
| CN | 103489399 A | 1/2014 |
| CN | 103839514 A | 6/2014 |
| CN | 103903556 A | 7/2014 |
| CN | 104036732 A | 9/2014 |
| CN | 104464635 A | 3/2015 |
| CN | 104575377 A | 4/2015 |
| CN | 104916257 A | 9/2015 |
| CN | 105206222 A | 12/2015 |
| CN | 105336292 A | 2/2016 |
| CN | 105427803 A | 3/2016 |
| TW | 200828241 A | 7/2008 |
| TW | 201220277 A1 | 5/2012 |
| TW | 201421442 A | 6/2014 |
| TW | 201421719 A | 6/2014 |
| TW | 201423701 A | 6/2014 |
| TW | 201523561 A | 6/2015 |

OTHER PUBLICATIONS

Office Action and Search Report dated Dec. 5, 2017, issued in counterpart Taiwanese Patent Application No. 106131488, with English translation. (17 pages).
Office Action dated Apr. 24, 2019, and Search Report dated Apr. 14, 2019, issued in counterpart Chinese Application No. CN201710797111.3, with 10 pages in Chinese and 1 page English summary.
Office Action dated May 15, 2019, and Search Report dated May 7, 2019, issued in counterpart Chinese Application No. CN201710797114.7, with 8 pages in Chinese and 1 page English summary.
Notice of Allowance and Search Report dated Jul. 1, 2019, issued in counterpart Taiwan Application No. 106129401, with 4 pages in Chinese.
Office Action and Search Report dated May 13, 2019 in counterpart Chinese Application No. CN201710822821.7, with 10 pages in Chinese.
Office Action and Search Report dated May 5, 2019, issued in counterpart Chinese Application No. CN201710778469.1, with 16 pages in Chinese.

\* cited by examiner

PIXEL CIRCUIT IN AN ELECTROLUMINESCENT DISPLAY

CROSS REFERENCE TO RELATED APPLICATIONS

This application claims priority to U.S. provisional application Ser. No. 62/421,435, filed Nov. 14, 2016, the disclosure of which is hereby incorporated herein by reference.

BACKGROUND

An electroluminescent (EL) display, such as an active matrix organic light emitting diode (AMOLED) display, may include an array of pixels. Each of the pixels may include an EL device, a switching transistor for transfer data that contains information on luminescence, and a driving transistor for driving the EL device to emit light according to the data. While such EL display enjoys the benefit of relatively low power consumption, display non-uniformity may exist among pixels due to process factors in semiconductor manufacturing. It may thus be desirable to have a circuit that solves the problem.

SUMMARY

Embodiments of the present invention provide a circuit that includes an electroluminescent (EL) device, a transistor, a first capacitor and a second capacitor. The transistor includes a gate coupled to a first node and a first terminal coupled to a second node. The first capacitor is coupled between a supply voltage and the first node. The second capacitor is coupled between the first node and the second node. The first capacitor and the second capacitor are configured to establish a compensation voltage associated with a threshold voltage of the transistor at the gate of the transistor in response to a first control signal, and establish the compensation voltage at the first terminal of the transistor in response to a second control signal. The transistor is configured to pass a current through the EL device. Moreover, the current has a magnitude independent of the threshold voltage of the transistor.

In an embodiment, the circuit further includes a transistor configured to reset a voltage level at the gate of the transistor in response to the first control signal.

In another embodiment, the circuit further includes a transistor configured to receive data associated with the EL device in response to the second control signal.

In yet another embodiment, the circuit further includes a transistor configured to allow the current to pass through the EL device.

In still another embodiment, the magnitude of the current is a function of a capacitance each of the first and second capacitors.

In an embodiment, the transistor includes a p-type transistor, and the current is expressed as:

$$|Isd| = k \times \left[ \frac{C1}{C1+C2} \times (VDD - Vdata) \right]^2$$

where Isd represents the magnitude of the current, k is constant, C1 and C2 represent capacitances of the first and second transistors, respectively, VDD represents the supply voltage, and Vdata represents a voltage level of data associated with the EL device.

In another embodiment, the transistor includes an n-type transistor, and the current is expressed as:

$$|Isd| = k \times \left[ \frac{C1}{C1+C2} \times (Vdata - VSS) \right]^2$$

where Isd represents the magnitude of the current, k is a constant, C1 and C2 represent capacitances of the first and second transistors, respectively, VSS represents the supply voltage, and Vdata represents a voltage level of data associated with the EL device.

In yet another embodiment, a pulse width of the first control signal is adjustable, and a pulse width of the second control signal is dependent of resolution of the display.

Some embodiments of the present invention provide an electroluminescent (EL) display that comprises an array of pixel units. Each of the pixel units includes an electroluminescent (EL) device, a transistor, a first capacitor and a second capacitor. The transistor includes a gate coupled to a first node and a first terminal coupled to a second node. The first capacitor is coupled between a supply voltage and the first node. The second capacitor is coupled between the first node and the second node. The first capacitor and the second capacitor are configured to establish a compensation voltage associated with a threshold voltage of the transistor at the gate of the transistor in response to a first control signal, and establish the compensation voltage at the first terminal of the transistor in response to a second control signal. The transistor is configured to pass a current through the EL device. Moreover, the current has a magnitude independent of the threshold voltage of the transistor.

In an embodiment, the EL display further includes a first transistor and a second transistor, which are configured to allow the current to pass through the EL device in response to a third control signal and a fourth control signal, respectively.

In another embodiment, the array of pixel units includes a first pixel unit on an (N−1)-th row of the array and a second pixel unit on an N-th row of the array and immediately adjacent to the first pixel unit, N being a natural number. The fourth control signal provided to the first pixel unit serves as the third control signal for the second pixel unit.

Embodiments of the present invention also provide a method of voltage compensation in an electroluminescent (EL) display that comprises an array of pixel units each including an EL device, a transistor, a first capacitor and a second capacitor. The method includes establishing a compensation voltage associated with a threshold voltage of the transistor at a first terminal of the transistor in response to a first control signal, establishing the compensation voltage at a gate of the transistor in response to a second control signal, storing data associated with the EL device in the first and second capacitors in response to a third control signal, and passing a current through the EL device via a first transistor and a fourth transistor in response to a third control signal and a fourth control signal, respectively. The current has a magnitude independent of the threshold voltage the transistor.

BRIEF DESCRIPTION OF THE DRAWINGS

Aspects of the present disclosure are best understood from the following detailed description when read with the accompanying figures. It is noted that, in accordance with the standard practice in the industry, various features are not

DETAILED DESCRIPTION

Figure 1:
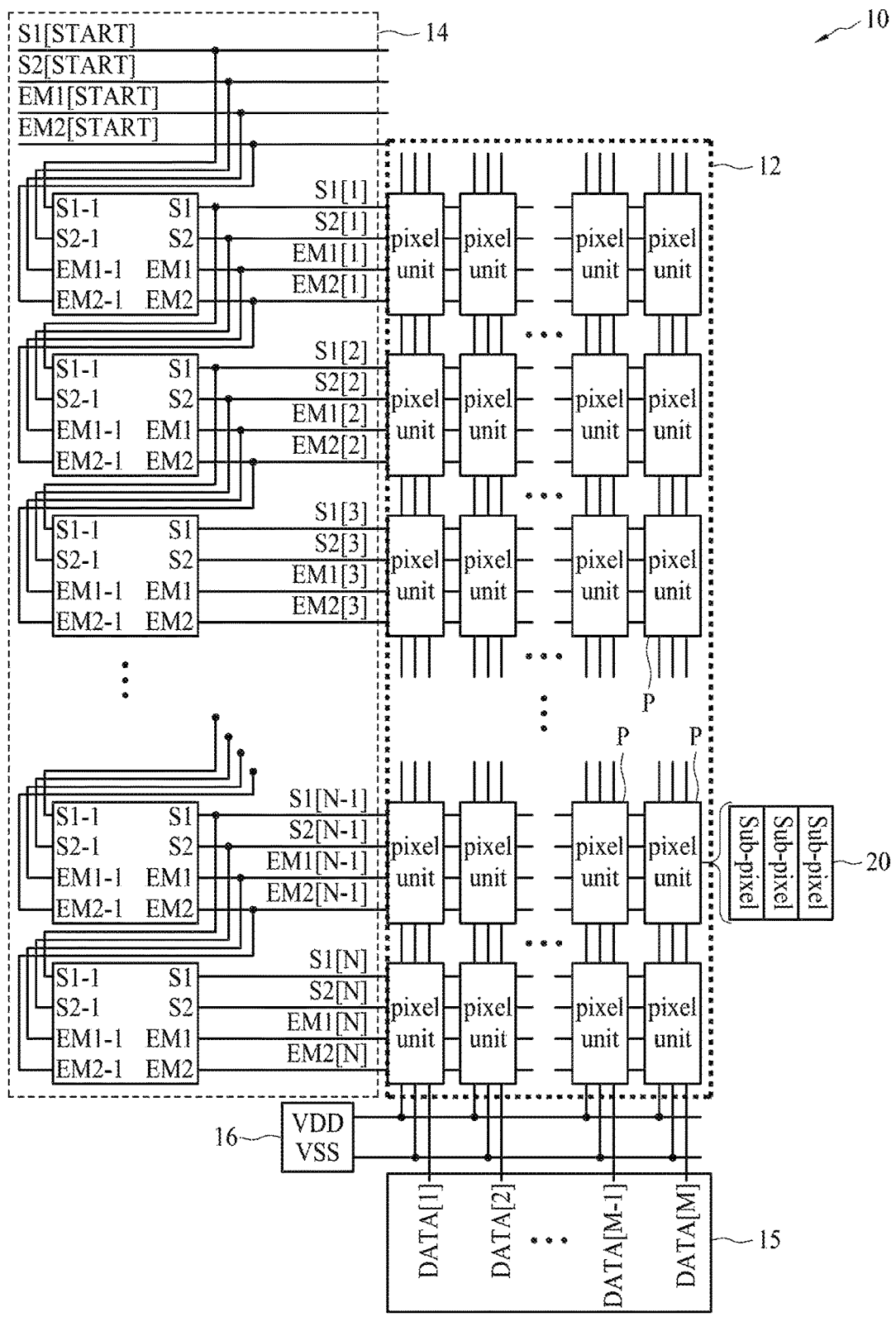
FIG. 1 is a block diagram of a display, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

In the below description, a signal is asserted with a logical high value to activate a corresponding device when the device is active high. In contrast, the signal is deasserted with a low logical value to deactivate the corresponding device. When the device is active low, however, the signal is asserted with a low logical value to activate the device, and is deasserted with a high logical value to deactivate the device.

FIG. 1 is a block diagram of a display 10, in accordance with an embodiment. The display 10 may include an electroluminescent (EL) display, for example, an active matrix organic light emitting diode (AMOLED) display.

Referring to FIG. 1, the display 10 includes an active area 12, a gate driver 14 and a source driver 15. The active area 12 includes an array of pixel units P arranged in, for example, an N×M matrix. The gate driver 14 provides control signals S1, S2, EM1 and EM2 through N scan lines to the N rows of pixel units. The source driver 15 provides data to a selected pixel of the M columns of pixel units through data lines DATA[1] to DATA[M]. Moreover, a power driver 16 provides supply voltages in a power rail of VDD and VSS to the active area 12. In an embodiment, VDD is approximately five volts (5V), and VSS is approximately −5V.

Each of the pixel units P in the active area 12 includes three sub-pixel units 20, which may be used to display color red (R), color green (G) and color blue (B). In other embodiments, for example, in a sub-pixel rendering (SPR) sensor, the number of sub-pixel units is not limited to three. In the present embodiment, the three sub-pixels 20 are arranged along the row direction. Accordingly, the number of data lines for the source driver 15 is 3×M.

Figure 2:
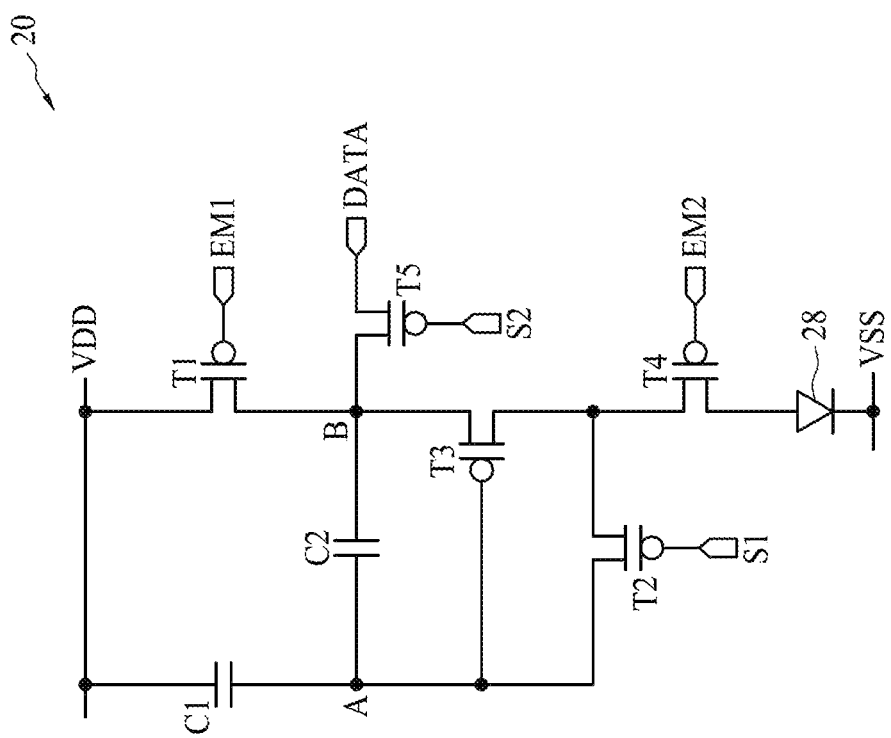
FIG. 2 is a circuit diagram of a sub-pixel unit in the display illustrated in FIG. 1, in accordance with an embodiment.

FIG. 2 is a circuit diagram of an exemplary sub-pixel unit 20 in the display 10 illustrated in FIG. 1, in accordance with an embodiment.

Referring to FIG. 2, the circuit includes an EL device 28, transistors T1 to T5, a first capacitor C1 and a second capacitor C2. The EL device 28 includes, for example, a current-driven element that may include an organic light emitting diode (OLED), a micro LED or a quantum dot LED (QLED). The first capacitor C1 and the second capacitor C2 serve as storage capacitors. The transistor T3 serves as a driving transistor to drive the EL device 28 according to data stored in the first and second capacitors C1 and C2. In the present embodiment, each of the transistors T1 to T5 includes a p-type thin film transistor (TFT) or a p-type metal-oxide-semiconductor (PMOS) transistor.

A gate of the transistor T2 receives a first control signal S1. A drain of the transistor T2 is coupled to a first node A. In addition, a gate of the transistor T3 is coupled to the first node A and hence the drain of the transistor T2. A source of the transistor T3 is coupled to a second node B. A drain of the transistor T3 is coupled to a source of the transistor T2. Persons having ordinary skill in the art will understand that drain and source terminals of a MOS transistor may be interchangeable, depending on voltage levels applied thereto.

Moreover, a gate of the transistor T5 receives a second control signal S2. A source of the transistor T5 receives data (labeled "DATA") on a corresponding data line from the source driver 15 in response to the second control signal S2. A drain of the transistor T5 is coupled to the second node B and hence the source of the transistor T3. In addition, a gate of the transistor T1 receives a third control signal EM1. A source of the transistor T1 receives a supply voltage VDD. A drain of the transistor T1 is coupled to the second node B and hence the drain of the transistor T5 and also the source of the transistor T3. Further, a gate of the transistor T4 receives a fourth control signal EM2. A source of the transistor T4 is coupled to the drain of the transistor T3 and hence the source of the transistor T2. A drain of the transistor T4 is coupled to an anode of the EL device 28. A cathode of the EL device 28 receives another supply voltage VSS.

The first capacitor C1 includes a first end to receive VDD and a second end coupled to the first node A. In addition, the second capacitor C2 includes a first end coupled to the first node A, and a second end coupled to the second node B.

Figure 3A:
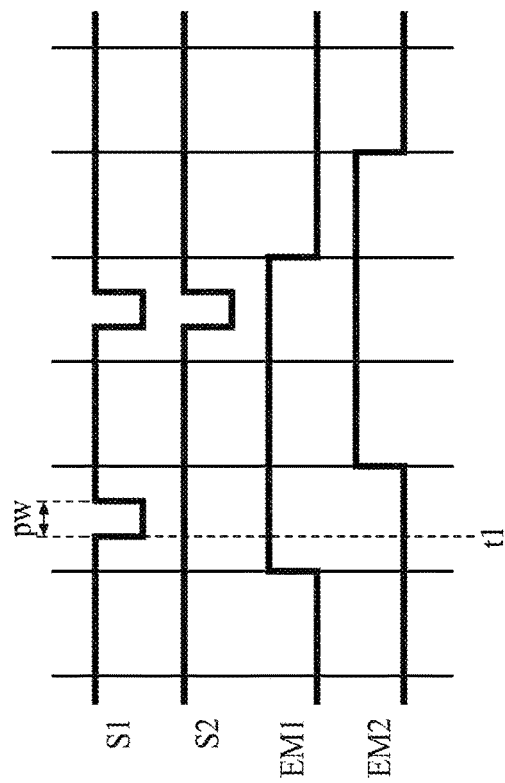
FIGS. 3A and 3B are diagrams showing a method of operating the circuit illustrated in FIG. 2 in a first phase, in accordance with some embodiments.
Figure 3B:
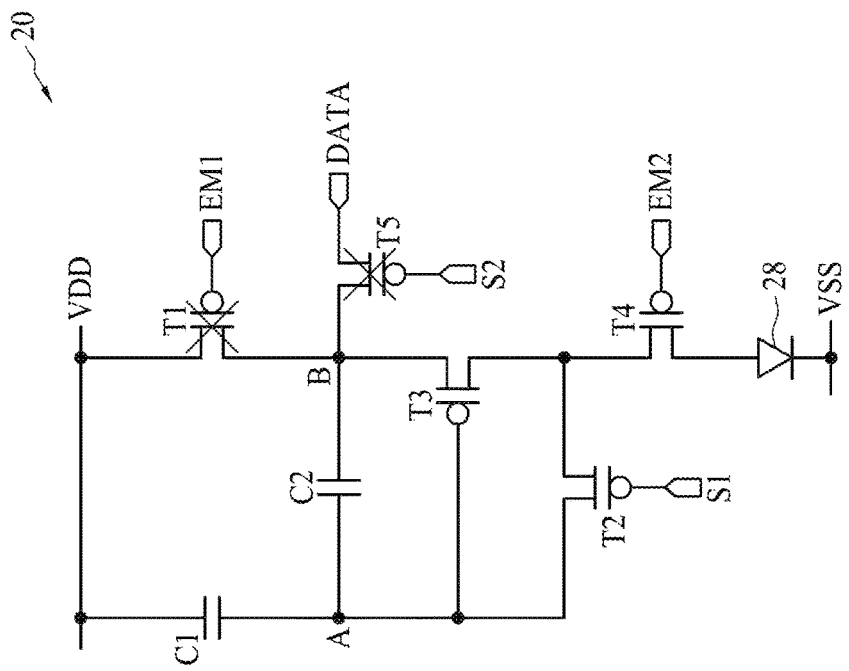

FIGS. 3A and 3B are diagrams showing a method of operating the circuit 20 illustrated in FIG. 2 in a first phase, in accordance with some embodiments.

Referring to FIG. 3A, the control signals S1, S2, EM1 and EM2 are configured to be active low in view of the p-type transistors T1 to T5. At time t1, the first control signal S1 is asserted at a falling edge, the second and third control signals S2 and EM1 kept at a high logical level are not asserted, and the fourth control signal EM2 is kept at a low logical level. As a result, referring to FIG. 3B, the transistors T2 and T4 are turned on, while the transistors T1 and T5 are turned off (a cross sign "X" labeled). Since the transistors T2 and T4 are turned on, a voltage level at the first node A (denoted as VA), and hence a voltage level at the gate of the transistor T3 (denoted as Vg), is pulled to VSS+|Vth_EL|, where |Vth_EL| is the threshold voltage of the EL device 28. In addition, a voltage level at the second node B (denoted as VB), and hence a voltage level at the source of the transistor T3 (denoted as Vs), is VSS+|Vth_EL|+|Vth3|, where |Vth3| is the threshold of driving transistor T3. Moreover, in a previous phase (the third phase to be discussed in FIGS. 5A and 5B), the voltage level of Vg satisfies Vg>VSS+|Vth_EL| so as to keep the transistor T3 at an on state.

Accordingly, during the first phase, VA (Vg) is reset to VSS+|Vth_EL|. Moreover, a first compensation is made to pull VB (Vs) to VSS+|Vth_EL|+|Vth3|. The threshold voltage of the driving transistor T3, |Vth3|, which serves as a compensation voltage, is established at the second node B during the first phase. VB or Vs can reach a desirable value of VSS+|Vth_EL|+|Vth3| by means of adjusting a pulse width pw of the first control signal S1. The pulse width pw of the first control signal S1 is a time period that the first control signal S1 stays activated. The time for establishing the compensation voltage, hereinafter "the compensation time," is positively proportional to the pulse width pw of the first control signal S1. Since the display 10 provides a refresh rate of 60 hertz (Hz) or 16.7 milliseconds (ms), which is perceivable to human vision, the resolution of the display 10 is defined as 16.7 ms/N, N being the number of rows of pixel units P in the display 10. As the display 10 gets more advanced, the value of N becomes larger and hence the resolution becomes smaller, which results in a more rigid compensation time. In existing displays, a higher resolution may mean a shorter compensation time. With the pulse width pw of the first control signal S1 being adjustable, the compensation time is not limited by the resolution of the display 10. As the compensation time becomes longer, the voltage level of VB reaches closer to the saturation voltage of the second capacitor C2, which alleviates the problem of rigid compensation time and enhances the display quality of the display 10.

Figure 4B:
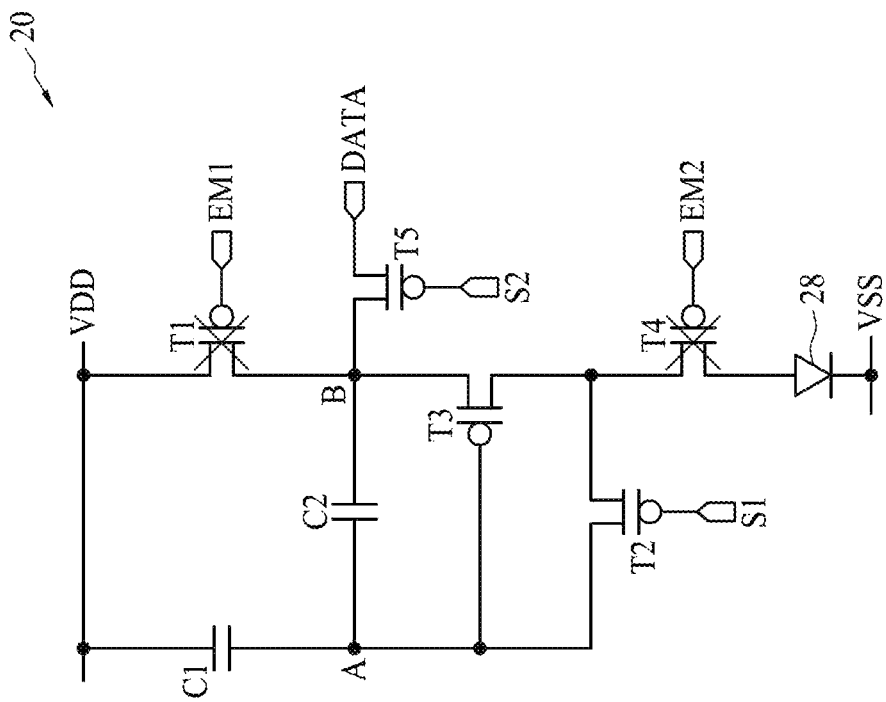
FIGS. 4A and 4B are diagrams showing a method of operating the circuit illustrated in FIG. 2 in a second phase, in accordance with some embodiments.
Figure 4A:
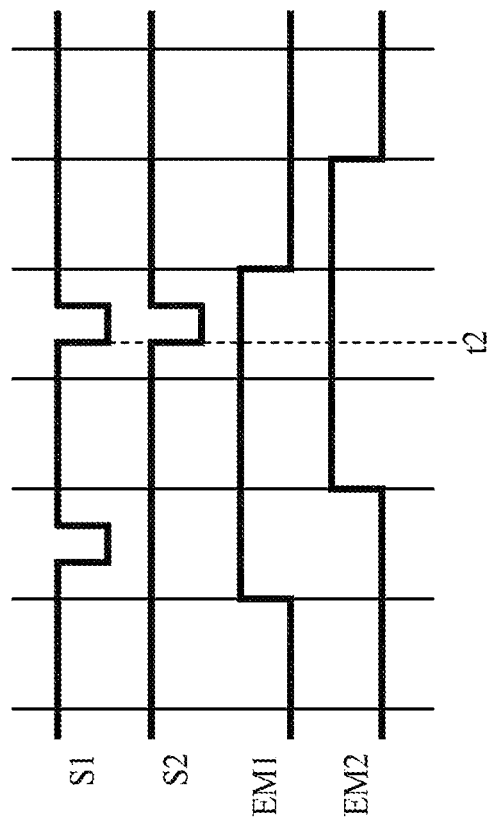

FIGS. 4A and 4B are diagrams showing a method of operating the circuit illustrated in FIG. 2 in a second phase, in accordance with some embodiments.

Referring to FIG. 4A, at time t2, the first and second control signals S1 and S2 are asserted, the third control signal EM1 stays at a high logical level, and the fourth control signal EM2 is not asserted. As a result, referring to FIG. 4B, the transistors T2 and T5 are turned on, and the transistors T1 and T4 are turned off. Since the transistor T5 is turned on, data is written to the second node B. Accordingly, VB (Vs) becomes Vdata, a voltage level of DATA to cause the EL device 28 to emit light accordingly. In addition, by the coupling function of the second capacitor C2, VA (Vg) becomes VDD-|Vth3|. With the second capacitor C2, a second compensation is effectively made on the basis of |Vsg| of the transistor T3, which substantially equals |Vth3|.

By comparison, for a circuit absent from the second capacitor C2, no such basis of |Vsg| is established when a second compensation is made. Accordingly, the second capacitor C2 facilitates an efficient and faster compensation.

While the compensation time for the first compensation is not limited by the resolution of a display, the compensation time for the second compensation depends on the resolution and may be, for example, shorter than a line time that equals 16.7 ms/N. Moreover, as the first compensation time is positively proportional to the pulse width of the first control signal S1, the second compensation time is positively proportional to the pulse width of the second control signal S2.

Figure 5B:
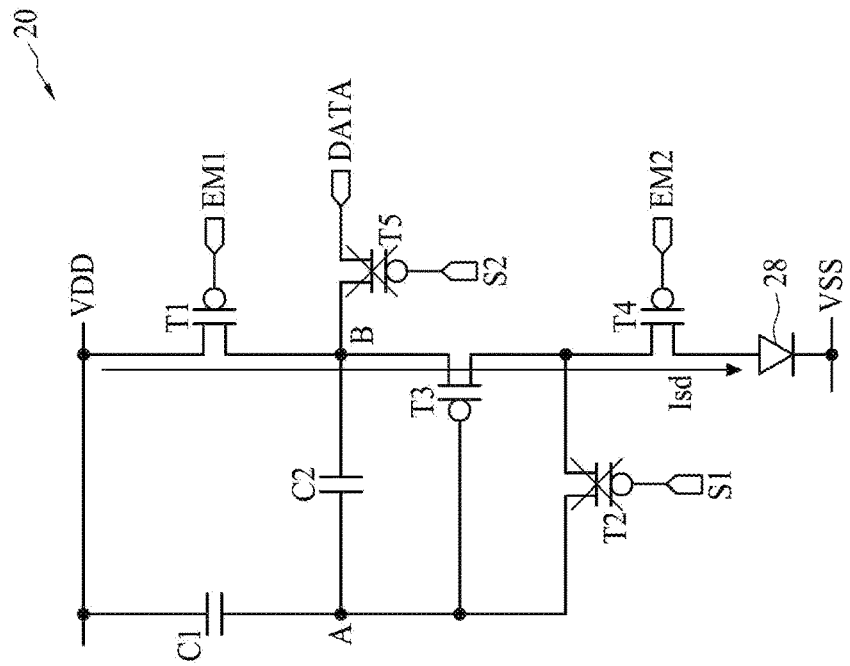
FIGS. 5A and 5B are diagrams showing a method of operating the circuit illustrated in FIG. 2 in a third phase, in accordance with some embodiments.
Figure 5A:
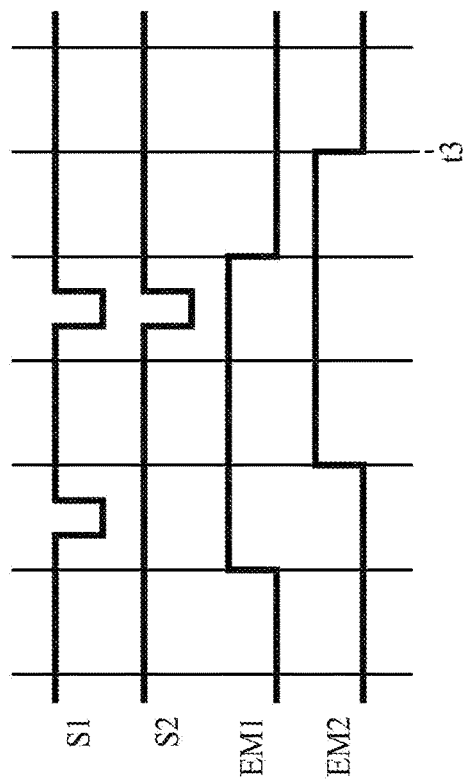

FIGS. 5A and 5B are diagrams showing a method of operating the circuit illustrated in FIG. 2 in a third phase, in accordance with some embodiments.

Referring to FIG. 5A, at time t3, the fourth control signal EM2 is asserted and the third control signal EM1 is logically low, while the first and second control signals S1 and S2 are not asserted. As a result, referring to FIG. 5B, the transistors T1 and T4 are turned on, and the transistors T2 and T5 are off. Since the transistor T1 is turned on, VB (Vs) becomes VDD. As VB changes from Vdata (second phase) to VDD (third phase), by function of the first and second capacitors C1 and C2, VA (Vg) becomes $$Vdata - |Vth3| + \left[\frac{C2}{C1+C2} \times (VDD - Vdata)\right],$$

in which C1 and C2 also represent capacitances of the first and second capacitors C1 and C2, respectively.

Moreover, a current Isd flows from the supply power VDD through the EL device 28 to VSS via the transistors T1, T3 and T4. The current Isd can be expressed in equation (1) below.

$$|Isd| = k \times (|Vsg| - |Vth3|)^2 \qquad \text{equation (1)}$$

where k is a constant. Since $$Vsg = Vs - Vg = VB - VA = |Vth3| + \left[\frac{C1}{C1+C2} \times (VDD - Vdata)\right],$$

equation (1) is rearranged in equation (2) as follows.

$$|Isd| = k \times \left[\frac{C1}{C1+C2} \times (VDD - Vdata)\right]^2 \qquad \text{equation (2)}$$

Since equation (2) is free of the Vth term, display quality of the display 10 is enhanced.

Figure 6:
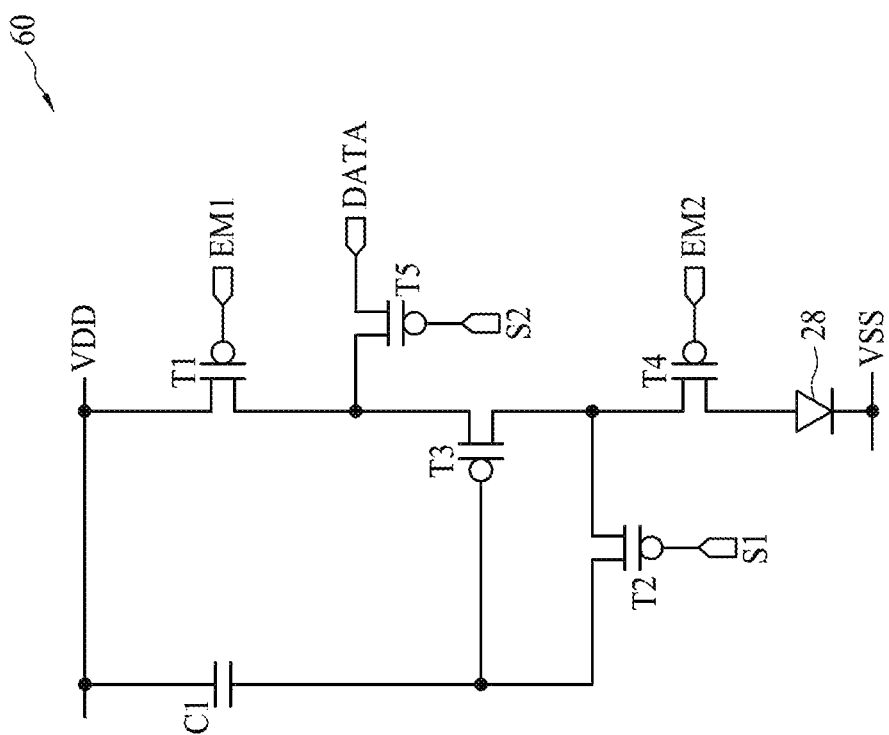
FIG. 6 is a circuit diagram of a sub-pixel unit in the display illustrated in FIG. 1, in accordance with another embodiment.

FIG. 6 is a circuit diagram of a sub-pixel unit 60 in the display 10 illustrated in FIG. 1, in accordance with another embodiment.

Referring to FIG. 6, the circuit is similar to that described and illustrated with reference to FIG. 2 except that, for example, the second capacitor C2 is absent, resulting in a five-transistor-one-capacitor (5T1C) circuit structure. The 5T1C circuit structure works normally as the 5T2C circuit structure illustrated in FIG. 2 except the function of fast compensation.

Figure 7B:
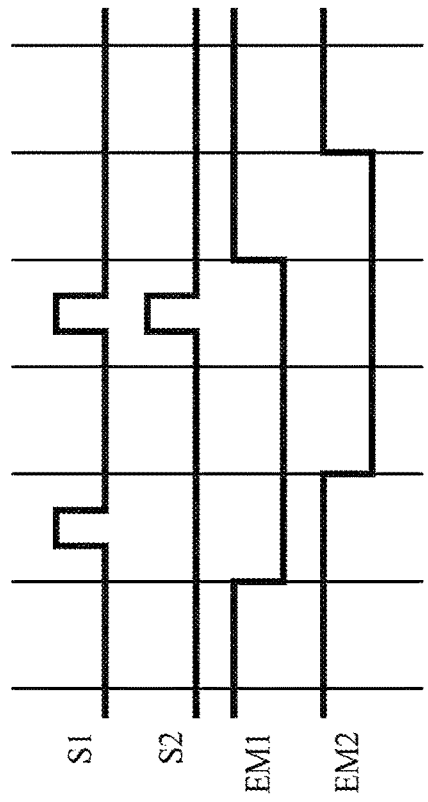
FIG. 7B is a timing diagram of control signals for operating the circuit illustrated in FIG. 7A, in accordance with some embodiments.
Figure 7A:
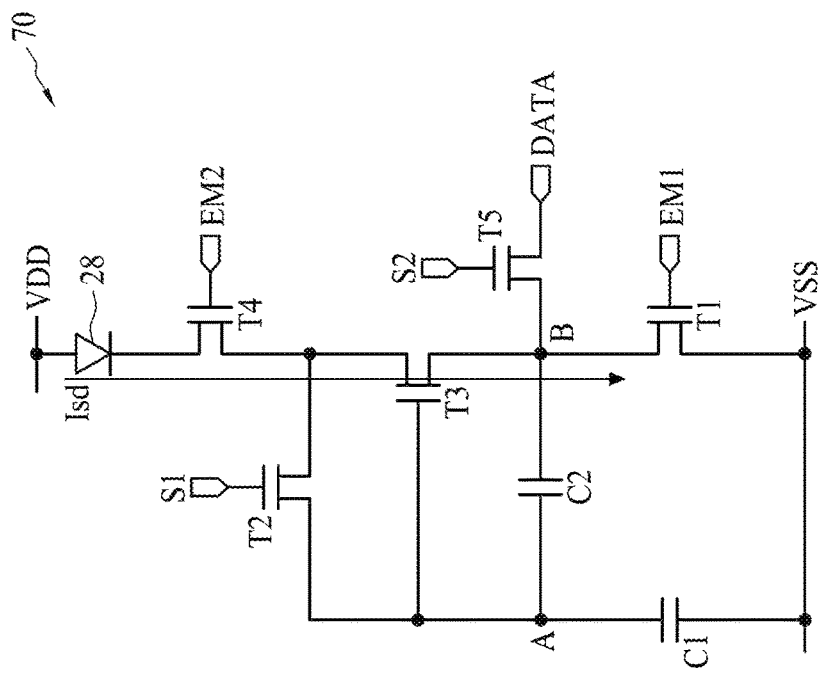
FIG. 7A is a circuit diagram of a sub-pixel unit in the display illustrated in FIG. 1, in accordance with still another embodiment.

FIG. 7A is a circuit diagram of a sub-pixel unit 70 in the display 10 illustrated in FIG. 1, in accordance with still another embodiment.

Referring to FIG. 7A, the circuit is similar to the circuit described and illustrated with reference to FIG. 2 except that, for example, n-type TFTs or NMOS transistors replace the PMOS transistors T1 to T5 in FIG. 2. Specifically, a gate of the transistor T2 receives a first control signal S1. A source of the transistor T2 is coupled to a first node A. In addition, a gate of the transistor T3 is coupled to the first node A and hence the source of the transistor T2. A source of the transistor T3 is coupled to a second node B. A drain of the transistor T3 is coupled to a drain of the transistor T2.

Moreover, a gate of the transistor T5 receives a second control signal S2. A drain of the transistor T5 receives data (labeled "DATA") on a corresponding data line from the source driver 15 in response to the second control signal S2. A source of the transistor T5 is coupled to the second node B and hence the source of the transistor T3. In addition, a gate of the transistor T1 receives a third control signal EM1. A source of the transistor T1 receives a supply voltage VSS. A drain of the transistor T1 is coupled to the second node B and hence the source of the transistor T5 and also the source of the transistor T3. Further, a gate of the transistor T4 receives a fourth control signal EM2. A source of the transistor T4 is coupled to the drain of the transistor T3 and hence the drain of the transistor T2. A drain of the transistor T4 is coupled to a cathode of the EL device 28. An anode of the EL device 28 receives another supply voltage VDD.

The first capacitor C1 includes a first end to receive VSS and a second end coupled to the first node A. In addition, the second capacitor C2 includes a first end coupled to the first node A, and a second end coupled to the second node B.

FIG. 7B is a timing diagram for operating the circuit illustrated in FIG. 7A, in accordance with some embodiments.

Referring to FIG. 7B, the control signals S1, S2, EM1 and EM2 are similar to those described and illustrated with reference to FIG. 3A, 4A or 5A except that, for example, the control signals S1, S2, EM1 and EM2 in FIG. 7B are active high or asserted at a rising edge.

In operation, during the first phase, VA (Vg) is reset to VDD−|Vth_EL|, and VB (Vs) due to a first compensation reaches VDD−|Vth_EL|−|Vth3|. In addition, during the second phase, VB (Vs) is written to Vdata, and VA (Vg) due to a second compensation reaches Vdata+|Vth3|. Subsequently, during the third phase, VB (Vs) becomes VSS, while VA (Vg) is $$Vdata - |Vth3| + \left[\frac{C2}{C1+C2} \times (VSS - Vdata)\right].$$

A current Isd flowing through the EL device in FIG. 7A can be expressed in equation (3) below.

$$|Isd| = k \times (|Vgs| - |Vth3|)^2 = k \times \left[\frac{C1}{C1+C2} \times (Vdata - VSS)\right]^2 \quad \text{equation (3)}$$

Figure 8:
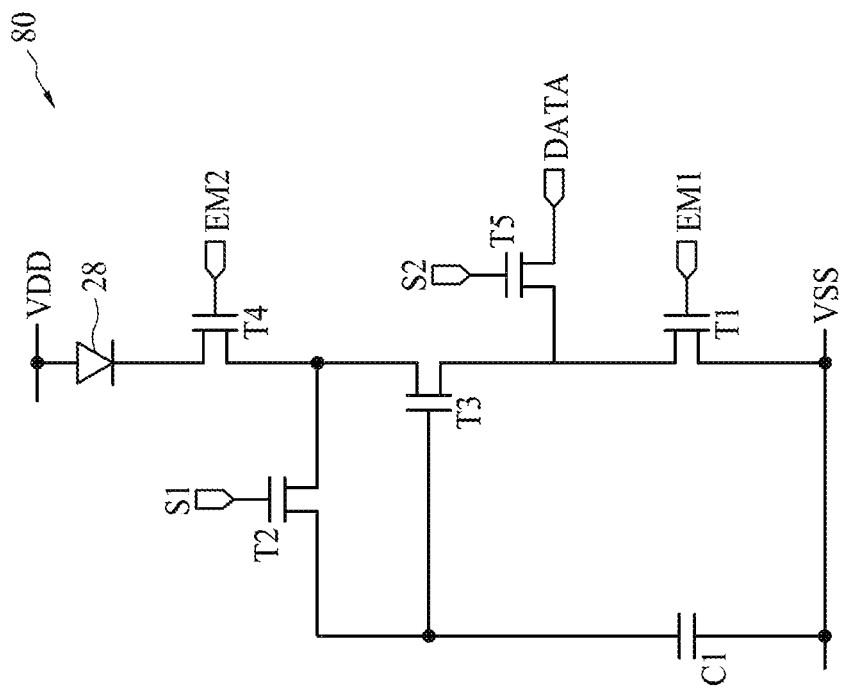
FIG. 8 is a circuit diagram of a sub-pixel unit in the display illustrated in FIG. 1, in accordance with yet another embodiment.

FIG. 8 is a circuit diagram of a sub-pixel unit 80 in the display 10 illustrated in FIG. 1, in accordance with yet another embodiment.

Referring to FIG. 8, the circuit is similar to that described and illustrated with reference to FIG. 7A except that, for example, the second capacitor C2 is absent. The 5T1C circuit structure works normally as the 5T2C circuit structure illustrated in FIG. 7A except the function of fast compensation.

Figure 9:
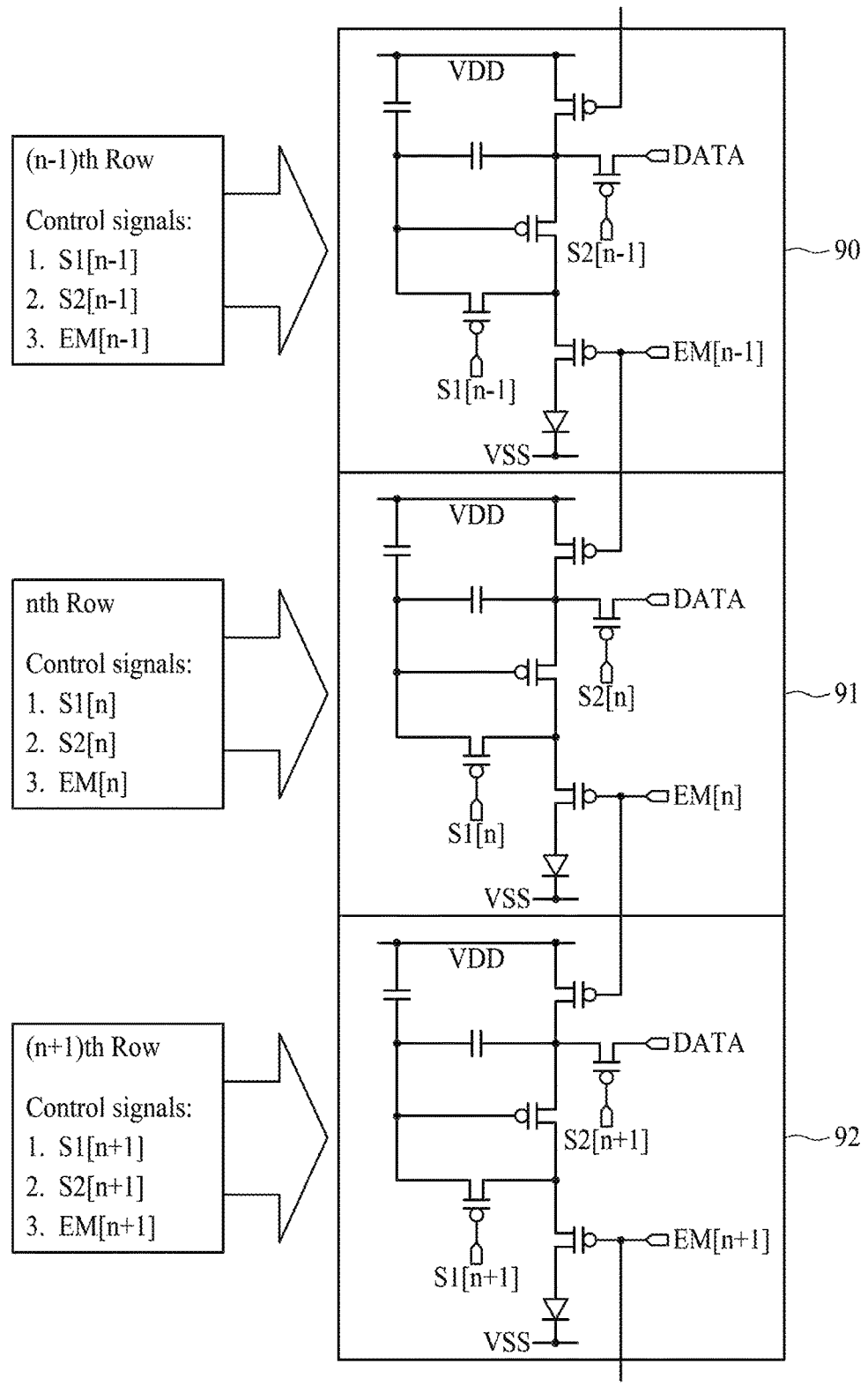
FIG. 9 is a circuit diagram of a sub-pixel unit, in accordance with an embodiment.

FIG. 9 is a diagram of a circuit structure of sub-pixel units, in accordance with an embodiment.

Referring to FIG. 9, the circuit structure is similar to that described and illustrated with reference to FIG. 2 except that, for example, sub-pixel units arranged along the column direction are configured to receive a fourth control signal EM2, that is provided to an immediately adjacent sub-pixel unit on a previous row, as a third control signal EM1. For discussion, only exemplary sub-pixel units 90, 91 and 92 are shown. In the sub-pixel unit 91, for example, a third control signal EM[n] that would otherwise be provided to a sub-pixel unit on an n-th row as in FIG. 3A, 4A or 5A is replaced by a fourth control signal EM[n−1] provided to a sub-pixel unit on an (n−1)-th row. Specifically, for the sub-pixel unit 91, a fourth control signal EM[n+1] provided to the sub-pixel unit 90 also serves as a third control signal coupled to the gate of the transistor T1 in the sub-pixel unit 91. In addition, for the sub-pixel unit 92, a fourth control signal EM[n] provided to the sub-pixel unit 91 also serves as a third control signal coupled to the gate of the transistor T1 in the sub-pixel unit 92. Effectively, the control mechanism is simplified.

Figure 10:
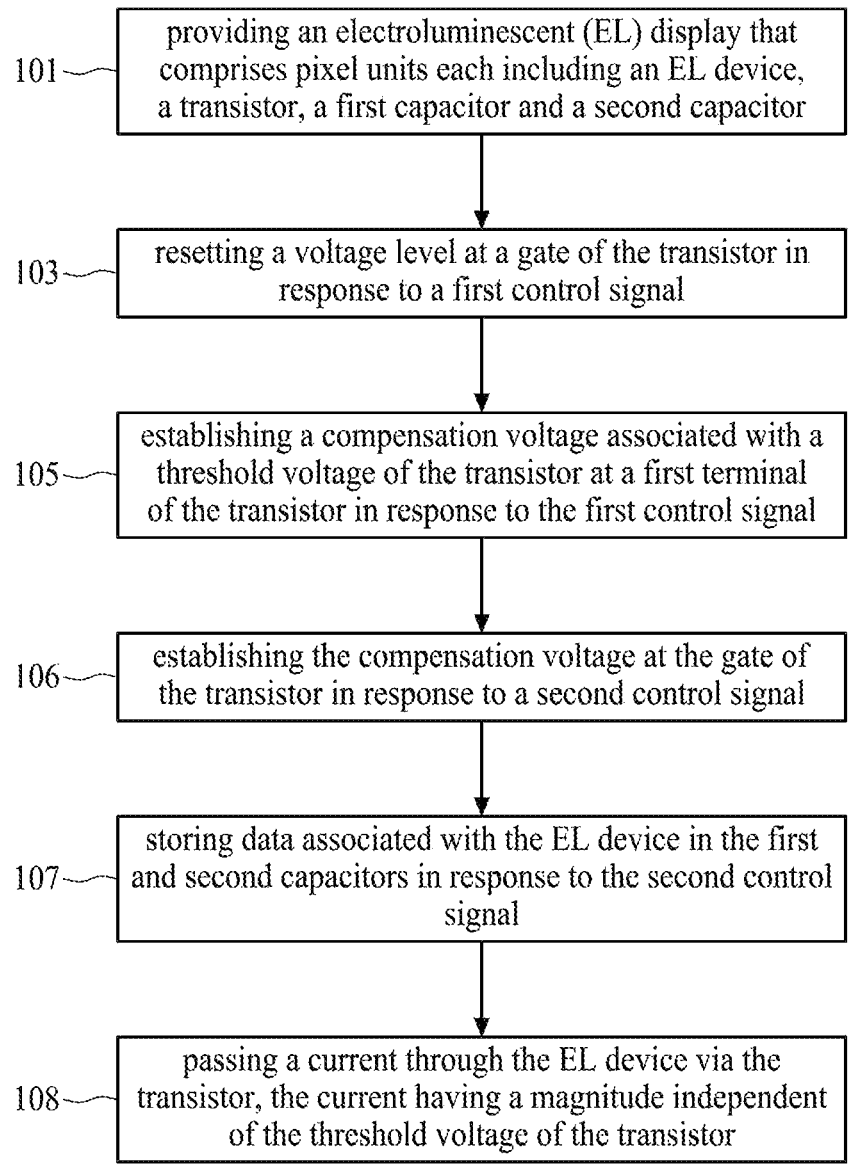
FIG. 10 is a flow diagram showing a method of voltage compensation in an electroluminescent display.

FIG. 10 is a flow diagram showing a method of voltage compensation in an electroluminescent display.

Referring to FIG. 10, in operation 101, an electroluminescent (EL) display is provided. The EL display includes an array of pixel units each including an EL device, a transistor, a first capacitor and a second capacitor.

Next, in operation 103, a voltage level at a gate of the transistor is reset in response to a first control signal. In an embodiment, the transistor includes a p-type transistor, and Vg is reset to VSS+|Vth_EL|. In another embodiment, the transistor includes an n-type transistor, and Vg is reset to VDD−|Vth_EL|.

In operation 105, a compensation voltage associated with a threshold voltage of the transistor is established at a first terminal of the transistor in response to the first control signal.

Then, in operation 106, the compensation voltage is established at the gate of the transistor in response to a second control signal.

In operation 107, data associated with the EL device is stored in the first and second capacitors in response to the second control signal.

Subsequently, in operation 108, a current is passed through the EL device via the transistor. The current has a magnitude independent of the threshold voltage the transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A circuit, comprising:
an electroluminescent (EL) device;
a transistor including a gate coupled to a first node and a first terminal coupled to a second node;
a first capacitor, coupled between a supply voltage and the first node; and a second capacitor, coupled between the first node and the second node, wherein the first capacitor and the second capacitor are configured to establish a compensation voltage associated with a threshold voltage of the transistor at the gate of the transistor in response to a first control signal, and establish the compensation voltage at the first terminal of the transistor in response to a second control signal, and wherein the transistor is configured to pass a current through the EL device, the current having a magnitude being independent of the threshold voltage of the transistor.

2. The circuit according to claim 1 further comprising a transistor configured to reset a voltage level at the gate of the transistor in response to the first control signal.

3. The circuit according to claim 1 further comprising a transistor configured to receive data associated with the EL device in response to the second control signal.

4. The circuit according to claim 1 further comprising a transistor configured to allow the current to pass through the EL device.

5. The circuit according to claim 1, wherein the magnitude of the current is a function of a capacitance each of the first and second capacitors.

6. The circuit according to claim 1, wherein the transistor includes a p-type transistor, and the current is expressed as:

$$|Isd| = k \times \left[ \frac{C1}{C1 + C2} \times (VDD - Vdata) \right]^2$$

where Isd represents the magnitude of the current, k is constant, C1 and C2 represent capacitances of the first and second transistors, respectively, VDD represents the supply voltage, and Vdata represents a voltage level of data associated with the EL device.

7. The circuit according to claim 1, wherein the transistor includes an n-type transistor, and the current is expressed as:

$$|Isd| = k \times \left[ \frac{C1}{C1 + C2} \times (Vdata - VSS) \right]^2$$

where Isd represents the magnitude of the current, k is a constant, C1 and C2 represent capacitances of the first and second transistors, respectively, VSS represents the supply voltage, and Vdata represents a voltage level of data associated with the EL device.

8. The circuit according to claim 1, wherein a pulse width of the first control signal is adjustable, and a pulse width of the second control signal is dependent of resolution of the display.

9. An electroluminescent (EL) display, comprising:
an array of pixel units, each of the pixel units comprising:
an EL device;
a transistor including a gate coupled to a first node and a first terminal coupled to a second node;
a first capacitor, coupled between a supply voltage and the first node; and
a second capacitor, coupled between the first node and the second node,
wherein the first capacitor and the second capacitor are configured to establish a compensation voltage associated with a threshold voltage of the transistor at the gate of the transistor in response to a first control signal, and establish the compensation voltage at the first terminal of the transistor in response to a second control signal, and wherein the transistor is configured to pass a current through the EL device, the current having a magnitude being independent of the threshold voltage of the transistor.

10. The electroluminescent display according to claim 9 further comprising a transistor configured to reset a voltage level at the gate of the transistor in response to the first control signal.

11. The electroluminescent display according to claim 9 further comprising a transistor configured to receive data associated with the EL device in response to the second control signal.

12. The electroluminescent display according to claim 9 further comprising a first transistor and a second transistor configured to allow the current to pass through the EL device in response to a third control signal and a fourth control signal, respectively.

13. The electroluminescent display according to claim 12, wherein the array of pixel units includes a first pixel unit on an (N−1)-th row of the array and a second pixel unit on an N-th row of the array and immediately adjacent to the first pixel unit, N being a natural number, and wherein the fourth control signal provided to the first pixel unit serves as the third control signal for the second pixel unit.

14. The electroluminescent display according to claim 9, wherein the magnitude of the current is a function of a capacitance each of the first and second capacitors.

15. The electroluminescent display according to claim 9, wherein the transistor includes a p-type transistor, and the current is expressed as:

$$|Isd| = k \times \left[ \frac{C1}{C1 + C2} \times (VDD - Vdata) \right]^2$$

where Isd represents the magnitude of the current, k is a constant, C1 and C2 represent capacitances of the first and second transistors, respectively, VDD represents the supply voltage, and Vdata represents a voltage level of data associated with the EL device.

16. The electroluminescent display according to claim 9, wherein the transistor includes an n-type transistor, and the current is expressed as:

$$|Isd| = k \times \left[ \frac{C1}{C1 + C2} \times (Vdata - VSS) \right]^2$$

where Isd represents the magnitude of the current, k is a constant, C1 and C2 represent capacitances of the first and second transistors, respectively, VSS represents the supply voltage, and Vdata represents a voltage level of data associated with the EL device.

17. The electroluminescent display according to claim 9, wherein a pulse width of the first control signal is adjustable, and a pulse width of the second control signal is dependent of resolution of the EL display.

18. A method of voltage compensation in an electroluminescent (EL) display that comprises an array of pixel units each including an EL device, a transistor, a first capacitor and a second capacitor, and the transistor includes a gate coupled to a first node and a first terminal coupled to a second node, the first capacitor couples between a supply voltage and the first node, and the second capacitor couples between the first node and the second node, the method comprising:
- establishing a compensation voltage associated with a threshold voltage of the transistor at a first terminal of the transistor in response to a first control signal;
- establishing the compensation voltage at a gate of the transistor in response to a second control signal;
- storing data associated with the EL device in the first and second capacitors in response to a third control signal; and
- passing a current through the EL device via a first transistor and a fourth transistor in response to a third control signal and a fourth control signal, respectively, the current having a magnitude independent of the threshold voltage the transistor;
- wherein the array of pixel units includes a first pixel unit on an (N−1)-th row of the array and a second pixel unit on an N-th row of the array and immediately adjacent to the first pixel unit, N being a natural number, further comprising:
- using the fourth control signal provided to the first pixel unit as the third control signal for the second pixel unit.

19. The method according to claim 18, further comprising:
- providing the first control signal having a pulse width that is adjustable; and
- providing the second control signal having a pulse width that is dependent of resolution of the EL display.

\* \* \* \* \*